(12) United States Patent
Ikeda et al.

(10) Patent No.: US 6,911,713 B2
(45) Date of Patent: Jun. 28, 2005

(54) OPTICAL DEVICE HAVING A CARRIER-DEPLETED LAYER

(75) Inventors: Nariaki Ikeda, Tokyo (JP); Takeharu Yamaguchi, Tokyo (JP); Satoshi Arakawa, Tokyo (JP); Nobumitsu Yamanaka, Tokyo (JP); Akihiko Kasukawa, Tokyo (JP); Ryusuke Nakasaki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 66 days.

(21) Appl. No.: 10/617,661

(22) Filed: Jul. 14, 2003

(65) Prior Publication Data

US 2004/0048406 A1 Mar. 11, 2004

(30) Foreign Application Priority Data

Jul. 12, 2002 (JP) ........................................ 2002-203372

(51) Int. Cl.[7] .............................................. H01L 31/00
(52) U.S. Cl. ............................. 257/466; 257/14; 257/21
(58) Field of Search .............................. 257/14, 21, 466

(56) References Cited

U.S. PATENT DOCUMENTS

| 5,319,661 | A | * | 6/1994 | Irikawa et al. | 372/46 |
| 5,452,315 | A | * | 9/1995 | Kimura et al. | 372/46 |
| 6,028,875 | A | * | 2/2000 | Knight et al. | 372/46 |
| 6,198,853 | B1 | * | 3/2001 | Yamada | 385/2 |

* cited by examiner

*Primary Examiner*—Allan R. Wilson
(74) *Attorney, Agent, or Firm*—Oblon, Spivak, McClelland, Maier & Neustadt, P.C.

(57) ABSTRACT

An EA-DFB module including a DFB laser diode and an EA modulator formed on an InP first-conductivity-type substrate has a mesa stripe, a current blocking structure formed on both side surfaces of the mesa strip and a second InP cladding layer formed on top of the mesa stripe and the current blocking structure. The current blocking structure includes a Fe-doped semi-insulating film, a first conductivity-type buried layer and a carrier-depleted layer. The carrier-depleted layer reduces the parasitic capacitance at the boundary between the first-conductivity-type buried layer and the second InP cladding layer.

20 Claims, 8 Drawing Sheets

OPTICAL DEVICE HAVING A CARRIER-DEPLETED LAYER

BACKGROUND OF THE INVENTION (a) Field of the Invention

The present invention relates to an optical device having a carrier-depleted layer.

(b) Description of the Related Art

An optical integrated device including a distributed-feedback (DFB) laser diode and an electro-absorptive optical modulator (referred to as simply EA modulator hereinafter) is generally referred to as EA-DFB module or EAML (electro-absorptive-modulated laser) module. The EA-DFB modulator has advantages over the conventional optical device having an external optical modulator in that the EA-DFB module has a smaller occupied area and can be fabricated with a lower cost. Thus, the EA-DFB module attracts more attention in the field of wavelength-division-multiplexing communication system. In particular, the EA-DFB module is noticed as a key device for implementing a light source in a metropolitan optical communication system.

The EA modulator includes an absorption layer having a quantum well structure, and uses an electro-absorption effect wherein the absorption coefficient for laser changes depending on the electric field applied therein. The operational principle of the EA modulator is such that the absorption layer is applied with a reverse bias voltage by using a quantum confined stark effect to shift the spectrum end of absorption by excitons toward a longer wavelength side, i.e., lower energy side, thereby absorbing the laser and thus reducing the laser intensity emitted by the DFB laser diode.

In general, the EA-DFB module has a buried structure wherein a Fe-doped InP (Fe-InP) electron trapping layer is buried on both sides of mesa stripes. The Fe-InP electron trapping layer is subjected to carrier depletion by the Fe dopant forming a deep energy level, which achieves a lower capacitance for the EA modulator. Some EA-DFB modules having the above structure are capable of operating for an effective optical modulation at rates as high as several tens of giga bits per second (Gbps).

Figure 7:
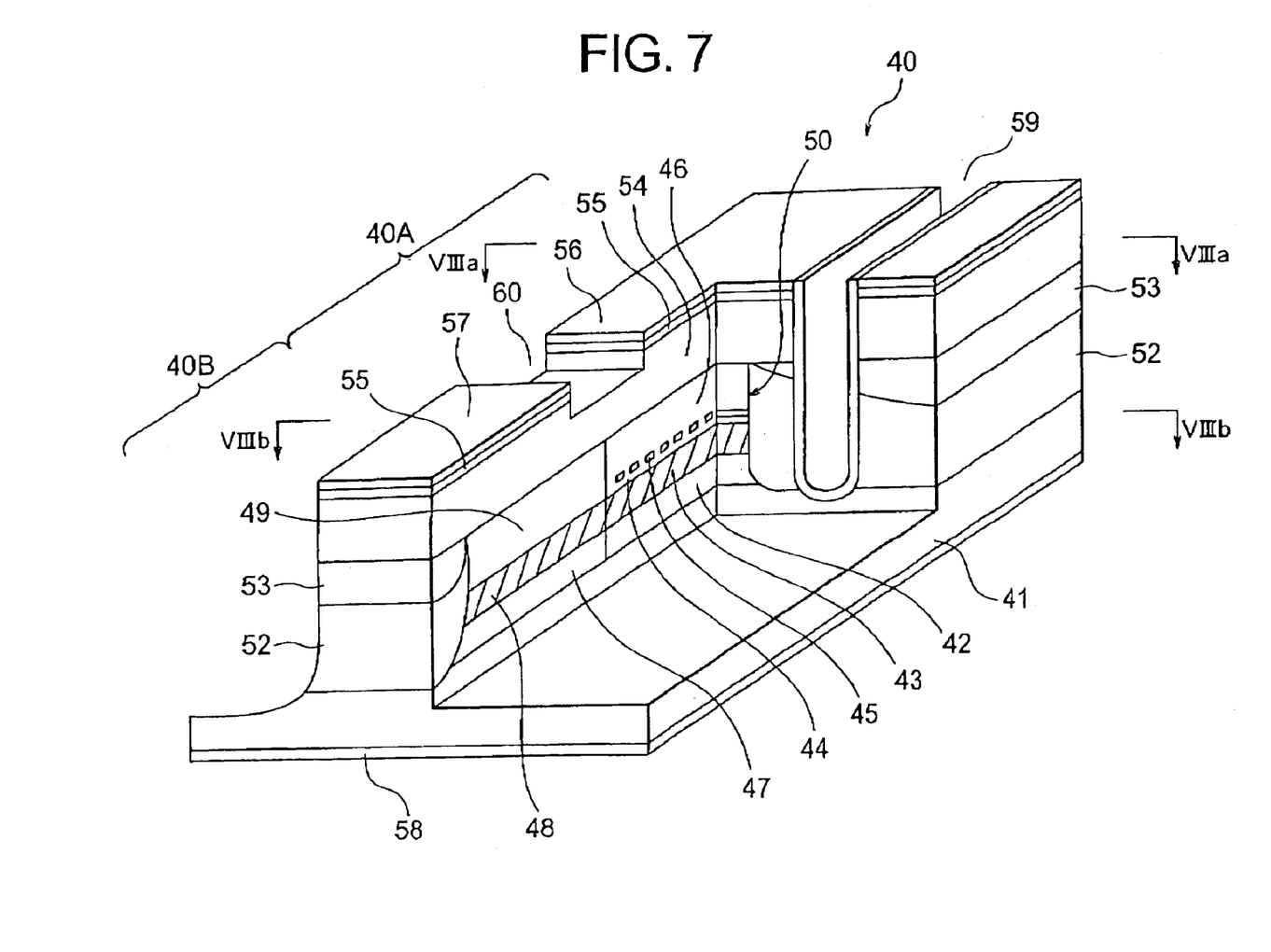
FIG. 7 is a partially cutout perspective view of a conventional EA-DFB module.

A conventional EA-DFB module will be described hereinafter with reference to FIG. 7 showing the layer structure of the EA-DFB module, and to FIGS. 8A and 8B taken along lines VIIIa—VIIIa and VIIIb—VIIIb, respectively, in FIG. 7.

The EA-DFB module 40 has a semi-insulating planar-buried-heterostructure (SI-PBH) including a buried Fe-InP layer as an electron trapping layer The EA-DFB module 40, as shown in FIG. 7, includes a DFB laser diode formed in the DFB laser area 40A and an EA modulator formed in the EA modulator area 40B. The DFB laser diode and the EA modulator are integrated in a monolithic structure and co-axially arranged on a common n-InP substrate 41 in the direction of optical axis of the waveguide.

Figure 8A:
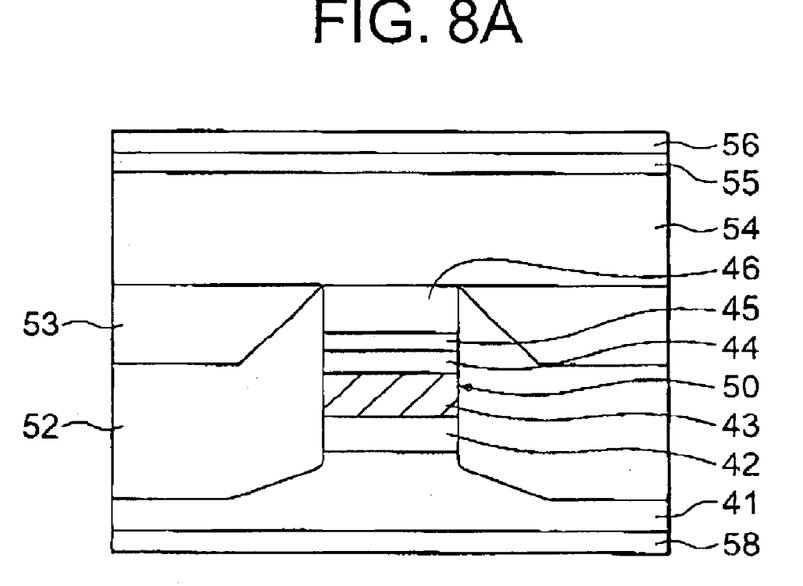
FIGS. 8A and 8B are sectional views taken along lines VIIIa—VIIIa and VIIIb—VIIIb, respectively, in FIG. 8.

The DFB laser area 40A, as shown in FIG. 8A, has a layer structure including an n-type InP (n-InP) lower cladding layer 42, a multiple-quantum-well separate-confinement-heterostructure (MQW-SCH) active layer structure 43, a p-InP spacer layer 44, a diffraction grating 45, and a p-InP upper cladding layer 46, which are consecutively formed on the n-InP substrate 41. Among the layers in the layer structure of the DFB laser area 40A, the p-InP upper cladding layer 46, diffraction grating 45, p-InP spacer layer 44, MQW-SCH active layer structure 43, n-InP lower cladding layer 42 and top portion of the n-InP substrate 41 are configured as a mesa stripe 50.

Figure 8B:
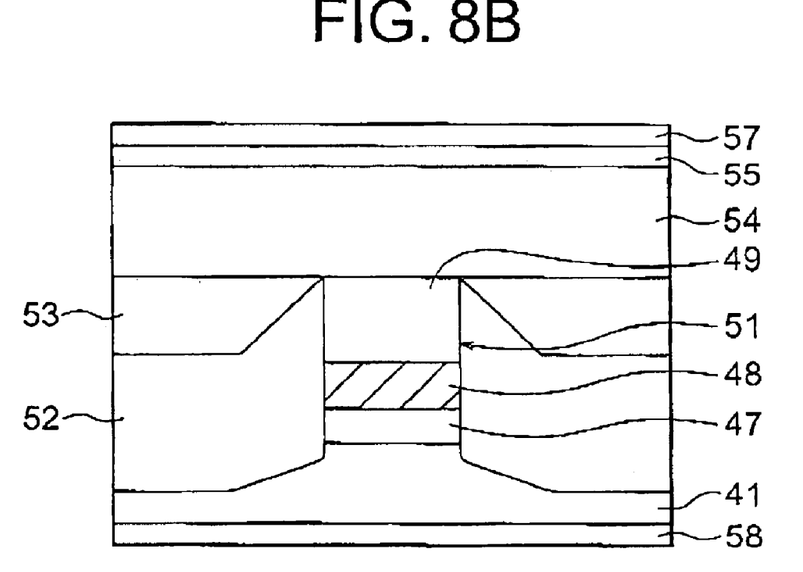

The EA modulator area 40B, as shown in FIG. 8B, has a layer structure including an n-InP lower cladding layer 47, a MQW-SCH absorption layer structure 48, and a p-InP upper cladding layer 49, which are consecutively formed on the n-InP substrate 41. Among the layers in the layer structure of the EA modulator area 40B, the p-InP upper cladding layer 49, MQW-SCH absorption layer structure 48, n-InP lower cladding layer 47, and top portion of the n-InP substrate 41 are configured as a mesa stripe 51 extending from the mesa stripe 50 of the DFB laser area 40A.

A current blocking structure is formed on both sides of the mesa stripes 50 and 51 in contact therewith, the current blocking structure including a semi-insulating Fe-InP electron trapping layer 52 and an n-InP hole blocking layer 53, which are consecutively buried on both the sides of the n-InP substrate 41.

A p-InP upper cladding layer 54 and a p-InGaAsP contact layer 55 are consecutively formed on top of the mesa stripes 50 and 51 and the n-InP hole blocking layer 53. A p-side electrode 56 is formed on the p-InGaAsP contact layer 55 in the DFB laser area 40A, whereas another p-side electrode 57 is formed the p-InGaAsP contact layer 55 in the EA modulator area 40B. A common n-side electrode 58 is formed on the bottom surface of the n-InP substrate 41 in the DFB laser area 40A and EA modulator area 40B.

As shown in FIG. 7, a deep trench 59 is formed outside the mesa stripes 50 and 51 in a spaced relationship therewith by etching the p-side electrodes 56 and 57, p-InGaAsP contact layer 55, p-InP upper cladding layer 54, n-InP hole blocking layer 53, Fe-InP electron trapping layer 52, and top portion of the n-InP substrate 41. The deep trench 59 reduces the parasitic capacitance of the EA-DFB module 40.

Among the layers in the layer structure in the vicinity of the boundary between the DFB laser area 40A and the EA modulator area 40B, the p-side electrodes 56 and 57, p-InGaAsP contact layer 55 and top portion of the p-InP upper cladding layer 54 are etched to configure a shallow trench 60 acting as an isolation trench. The isolation trench 60 electrically isolates the p-side electrode 56 from the p-side electrode 57.

The p-InP upper cladding layer 54 of the EA-DFB module has a relatively higher carrier density of about $1 \times 10^{18}$ cm$^{-3}$, which affords a lower device resistance for the DFB laser area 40A. In addition, the n-InP hole blocking layer 53 has a relatively higher carrier density of $1 \times 10^{18}$ cm$^{-3}$ to $1 \times 10^{19}$ cm$^{-3}$, which affords a lower threshold current and a higher current-to-light conversion efficiency for the DFB laser area 40A.

However, the relatively higher carrier densities of the n-InP hole blocking layer 53 and the p-InP upper cladding layer 54 suppress expansion of the carrier-depleted layer generated in the vicinity of the boundary between the n-InP hole blocking layer 53 and the p-InP upper cladding layer 54 in the EA modulator area 40B. This results in a higher electric field across the boundary, degrading the reverse voltage tolerance in the EA modulator area 40B. Thus, the p-n junctions of some EA modulators cannot withstand the reverse bias voltage needed for performing an effective absorption operation, i.e., needed for obtaining a desired extinction ratio. The term "extinction ratio" as used herein means a ratio of the minimum laser intensity to the maximum laser intensity obtained at the output of the EA modulator.

In addition, the higher electric field may damage the p-n junction of the current blocking structure of the EA modulator area 40B; even if the EA-DFB module has a reverse voltage tolerance sufficient for obtaining a desired extinction ratio.

SUMMARY OF THE INVENTION

In view of the above, it is an object of the present invention to provide an optical device having an excellent reverse voltage tolerance characteristic, thus performing desired absorption function at a lower reverse bias voltage, and suited for use as an EA modulator in an EA-DFB module.

It is another object of the present invention to provide a method for manufacturing an optical device such as an EA modulator described above.

The present invention provides an optical device including: a first-conductivity-type semiconductor substrate; a mesa stripe overlying the semiconductor substrate and including an active layer; a layer structure formed on both side surfaces of the mesa stripe in contact therewith, the layer structure including a semi-insulating layer, a first-conductivity-type buried layer and a carrier-depleted layer consecutively formed as viewed from the semiconductor substrate; and a second-conductivity-type cladding layer formed on top of the mesa stripe and the carrier-depleted layer.

In accordance with the optical device of the present invention, the carrier-depleted layer alleviates the electric field in the vicinity of the boundary between the first-conductivity-type buried layer and the semi-insulating layer to raise the reverse voltage tolerance of the p-n junction formed by the first-conductivity-type buried layer and the semi-insulating layer.

The structure of the optical device of the present invention is particularly suited as an EA modulator for integration with a DFB laser diode to form an EA-DFB module.

Examples of the optical device of the present invention include, in addition to the EA modulator as described above, waveguide photodetector (photodiode), attenuator and Mach-Zehnder modulator etc., each of which is desired to have a higher reverse voltage tolerance.

The present invention also provides a method for manufacturing an optical device, including the steps of: forming a mesa stripe overlying a first-conductivity-type semiconductor substrate and including an active layer; forming consecutively a semi-insulating film, a first-conductivity-type buried layer, and a carrier-depleted layer, which are buried on both side surfaces of the mesa stripe; and forming a second-conductivity-type cladding layer on top of the mesa stripe and the carrier-depleted layer, wherein: the first-conductivity-type buried layer is grown on a first growth rate when a plane orientation of the first first-conductivity-type buried layer extending from a top of the side surface of the mesa stripe resides between a (111) B-plane and a (11x) B-plane, and grown on a second growth rate larger than the first growth rate after the plane orientation reaches a (11x) plane where x≧2.

In accordance with the method of the present invention, the first-conductivity-type buried layer has a suitable structure in the edge thereof with respect to the top of the side surface of the mesa stripe, thereby allowing an excellent current blocking structure.

In accordance with the method of the present invention, a desirable distance of 3 μm or below is obtained between the edge of the second first-conductivity-type buried layer and the top of the sides of the mesa stripe due to the lower growth rate of the first first-conductivity-type buried layer.

The above and other objects, features and advantages of the present invention will be more apparent from the following description, referring to the accompanying drawings.

PREFERRED EMBODIMENT OF THE INVENTION

Now, the present invention is more specifically described with reference to accompanying drawings.

Figure 1:
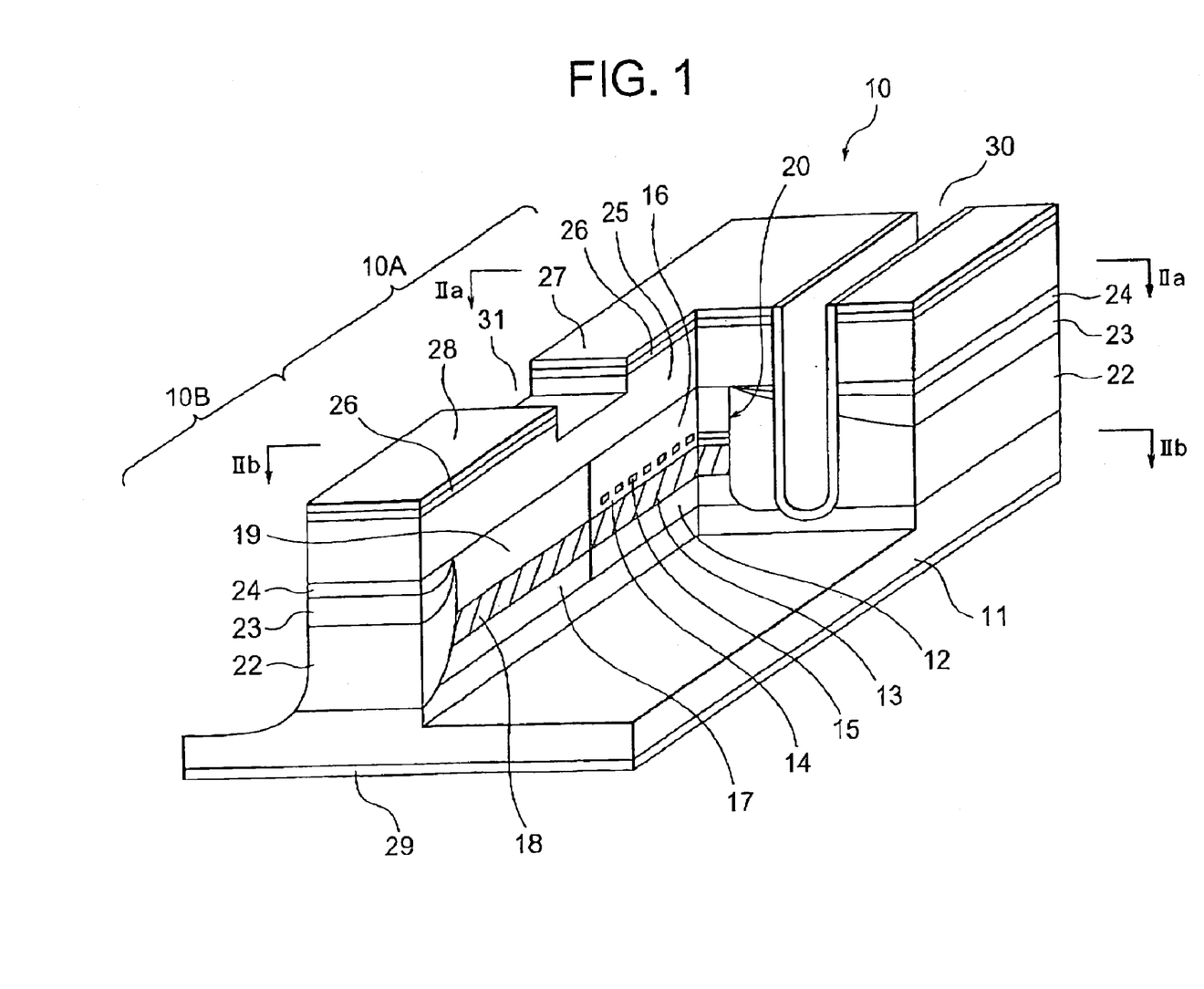
FIG. 1 is a partially cutout perspective view of an EA-DFB module including an EA modulator according to an embodiment of the present invention.

Referring to FIG. 1, an EA-DFB module generally designated by numeral 10 is of a SI-PBH type and includes a Fe-InP layer acting as an electron trapping layer in an EA modulator according to an embodiment of the present invention. The EA-DFB module 10 includes a DFB laser diode formed in the DFB laser area 10A and the EA modulator formed in the EA modulator area 10B, which are integrated in a monolithic structure and co-axially arranged on a common n-InP substrate 11 in the direction of axis of the optical waveguide.

Figure 2A:
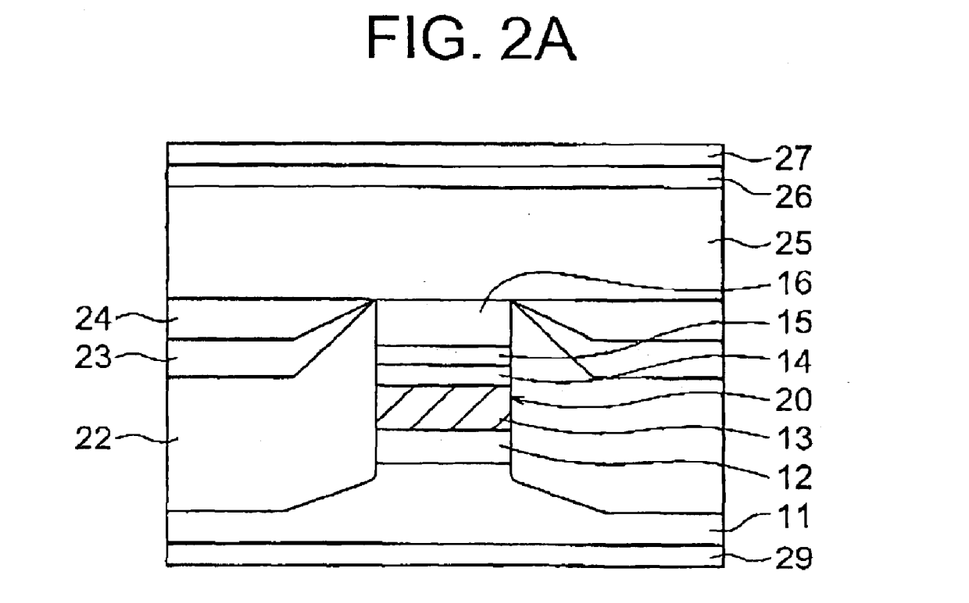
FIGS. 2A and 2B are sectional views taken along lines IIa—IIa and IIb—IIb, respectively, in FIG. 1.

The DFB laser area 10A, as shown in FIG. 2A, has a layer structure including an n-InP lower cladding layer 12, a MQW-SCH active layer structure 13, p-InP spacer layer 14, a diffraction grating 15, and a p-InP upper cladding layer 16, which are consecutively formed on the n-InP substrate 11. Among the layers in the layer structure of the DFB laser area 10A, the p-InP upper cladding layer 16, diffraction grating 15, p-InP spacer layer 14, MQW-SCH active layer structure 13, n-InP lower cladding layer 12 and top portion of the n-InP substrate 11 are configured as a mesa stripe 20.

Figure 3A:
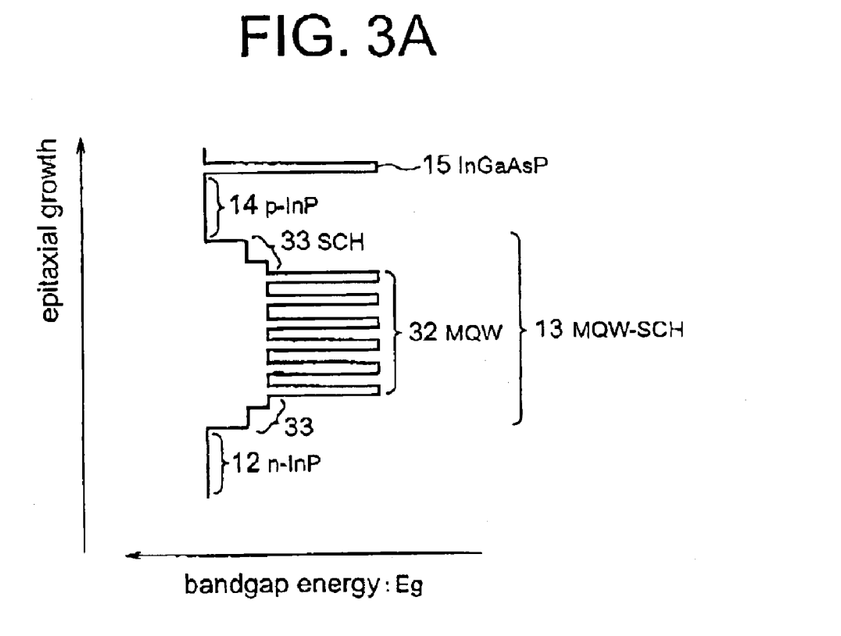
FIGS. 3A and 3B are graphs showing bandgap energy profiles along the direction of epitaxial growth in the DFB laser area and the EA modulator area, respectively.

Referring to FIG. 3A, there is shown the bandgap energy (Eg) profile of the DFB laser area 10A along the direction of epitaxial growth. The MQW-SCH active layer structure 13 includes a MQW structure 32 and a pair of 2-step SCHs 33 sandwiching therebetween the MQW structure 32. The MQW structure 32 includes six well layers each having a bandgap wavelength λg of 1.55 μm and a thickness of 4.5 nm, and five barrier layers each sandwiched between adjacent two of the well layers. Each barrier layer has a bandgap wavelength λ g of 1.2 μm and a thickness of 12 nm. Each 2-step SCH 33 includes a first SCH step having a bandgap wavelength λ g of 1.21 μm and a thickness of 12 nm, and a second SCH step having a bandgap wavelength λ g of 1.1 μm and a thickness of 20 nm. The diffraction grating 15 has a bandgap wavelength λ g of 15 μm and a thickness of 20 nm.

Figure 2B:
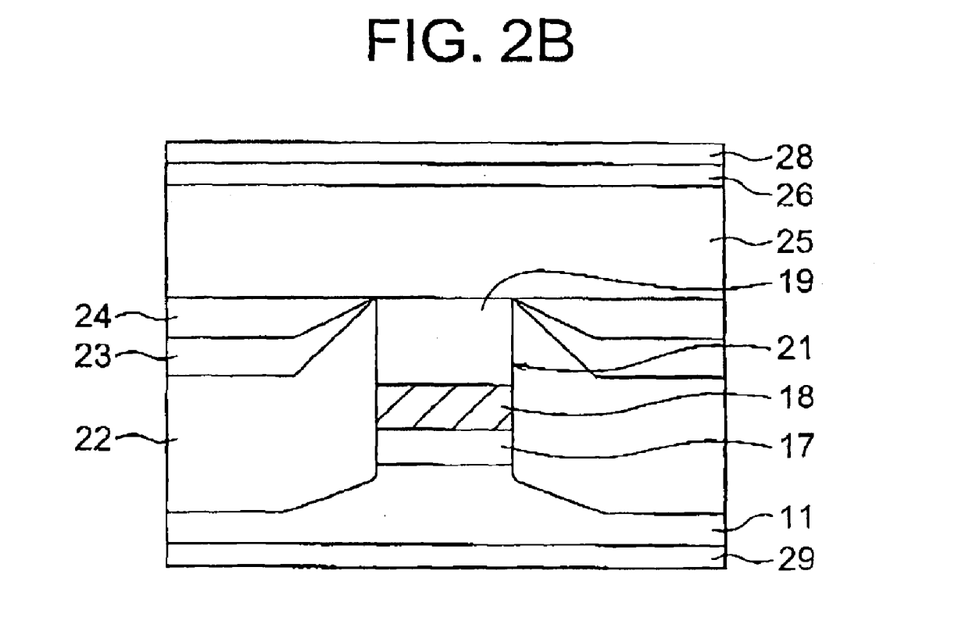

The EA modulator area 10B, as shown in FIG. 2B, has a layer structure including an n-InP lower cladding layer 17, a MQW-SCH absorption layer structure 18, and a p-InP upper cladding layer 19, which are consecutively formed on the n-InP substrate 11. Among the layers in the layer structure of the EA modulator area 10B, the p-InP upper cladding layer 19, MQW-SCH structure 18, n-InP lower cladding layer 17, and top portion of the n-InP substrate 11 are configured as a mesa stripe 21 extending from the mesa stripe 20 of the DFB laser area 10A.

Figure 3B:
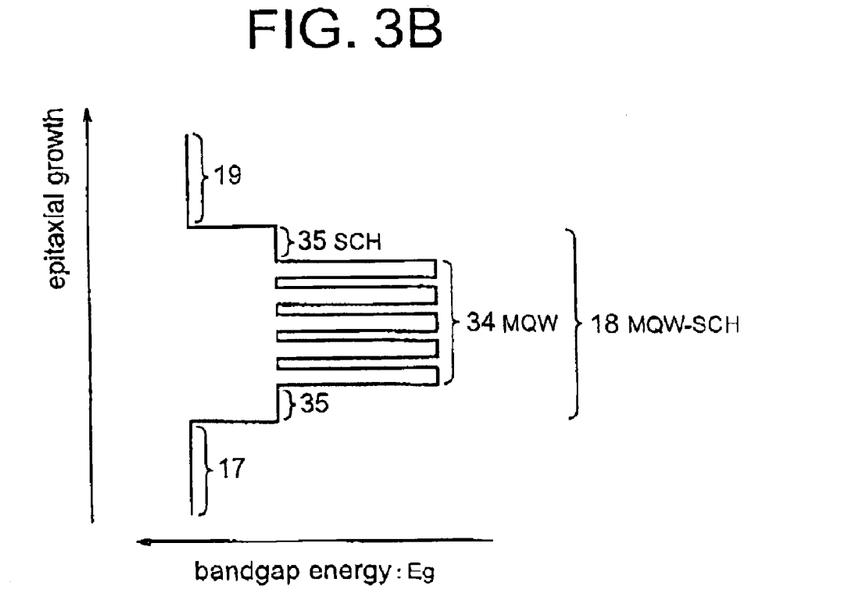

Referring to FIG. 3B, there is shown the bandgap energy (Eg) profile of the EA modulator area 10B along the direction of the epitaxial growth. The MQW-SCH absorption layer structure 18 includes a MQW structure 34 and a pair of SCHs 35 sandwiching therebetween the MQW structure 34. The MQW structure 34 includes five well layers each having a bandgap wavelength λ g of 1.51 μm and a thickness of 10 nm, and four barrier layers each sandwiched between adjacent two of the well layers. Each barrier layer has a bandgap wavelength λ g of 1.1 μm, and a thickness of 4 nm.

The extinction ratio obtained by the MQW structure 34 in the EA modulator area 10B is affected mainly by the number and thickness of the well layers. The number and thickness of the well layers in the MQW structure 34 as recited above are considered optimum for obtaining a large extinction ratio in the present invention.

The well layers of the MQW structure are made of a III–V group semiconductor, which may include therein thallium (Tl). Examples of the semiconductor used for the well layer include InGaAsP, InGaAlAs, InGaTlAsP, and InGaTlAlAs. Inclusion of Tl in the well layer of the EA modulator allows a lower temperature dependency of the bandgap wavelength, whereby the detuning amount, i.e., the difference between the emission wavelength of the DFB laser device and the wavelength of the absorption end of the EA modulator can be stabilized.

The SCH 35 of the MQW-SCH absorption layer structure 18 in the EA modulator area 10B includes a semiconductor layer having a bandgap wavelength of 1.1 μm and a thickness of 50 nm, whereby the mode field is set near the mode field of the DFB laser area 10A.

As shown in FIGS. 2A and 2B, a current blocking structure is formed on both sides of each of mesa stripes 20 and 21, the current blocking structure including a semi-insulating Fe-InP electron trapping layer 22, an n-InP hole blocking layer 23 and an undoped InP (i-InP) layer 24, which are consecutively buried on both sides of the each of the mesa stripes 20 and 21. The i-InP layer 24 may have an n-type carrier density below $10^{17}$ cm$^{-3}$, and include residual impurities such as Si, Se, S, C, Sn and Te. Alternatively, the i-InP layer 24 may have a p-type carrier density below $10^{17}$ cm$^{-3}$, and include residual impurities such as Cd, Zn, Be and Mg.

The Fe-InP layer 22 functions as an electron trapping layer which traps therein electrons to thereby deplete the Fe-InP layer 22, thereby reducing the parasitic capacitance of the DFB laser diode. The Fe-InP layer 22 may be replaced by a Ru-doped layer. The n-InP hole blocking layer 23 forms a p-n junction in association with a p-InP upper cladding layer 25 (described later) to block the holes. The n-InP hole blocking layer 23 may have a carrier density of $1 \times 10^{18}$ cm$^{-3}$ to $1 \times 10^{19}$ cm$^{-3}$. This allows the DFB laser area 40 to have excellent laser characteristics such as a lower threshold current, and higher current-to-light conversion efficiency.

Provision of the i-InP layer 24 allows the carriers in the vicinity thereof to be depleted, thereby alleviating the electric field between the n-InP hole blocking layer 23 and the p-InP upper cladding layer 25 in the EA modulator area 10B. In other words, the i-InP layer 24 functions as a carrier-depleted layer. This improves the reverse voltage tolerance of the EA modulator area 10B. In addition, the alleviation of the electric field enhances the hole blocking function of the n-InP hole blocking layer 23 in association with the p-InP upper cladding layer 25, whereby a higher extinction ratio can be obtained at a lower reverse bias voltage. The carrier-depleted layer may have a thickness of 0.1 to 0.5 μm.

The p-InP upper cladding layer 25 as described above and a p-InGaAsP contact layer 26 are consecutively formed on top of the mesa stripes 20 and 21 and on the i-InP layer 24 formed on both sides thereof. A p-side electrode 27 is formed on the p-InGaAsP contact layer 26 in the DFB laser area 10A, whereas another p-side electrode 28 is formed the p-InGaAsP contact layer 26 in the EA modulator area 10B. A common n-side electrode 29 is formed on the bottom surface of the n-InP substrate 11 in the DFB laser area 10A and EA modulator area 10B.

As shown in FIG. 1, a deep trench 30 is formed outside the mesa stripes 20 and 21 in a spaced relationship therewith by etching the p-side electrodes 27 and 28, p-InGaAsP contact layer 26, p-InP upper cladding layer 25, i-InP layer 24, n-InP hole blocking layer 23, Fe-InP electron trapping layer 22, and top portion of the n-InP substrate 11. The deep trench 30 reduces the parasitic capacitance of the EA-DFB module 10.

Among the layers in the layer structure in the vicinity of the boundary between the DFB laser area 10A and the EA modulator area 10B, the p-side electrodes 27 and 28, p-InGaAsP contact layer 26 and top portion of the p-InP upper cladding layer 25 are etched to configure a shallow trench 31 acting as an isolation trench. The isolation trench 31 electrically isolates p-side electrode 27 from p-side electrode 28.

In the above configurations of the EA-DFB module 10 of the present embodiment, the EA modulator has an excellent reverse voltage tolerance characteristic, and a higher extinction ratio at a lower reverse bias voltage. It is to be noted that the i-InP layer 24 may be replaced by a Fe-doped or Ru-doped InP layer in the above embodiment.

Figure 4A:
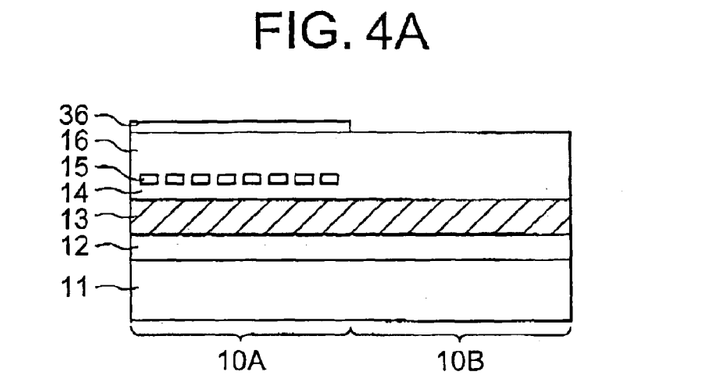
FIGS. 4A to 4C are sectional views of the EA-DFB module taken along the axial direction of the optical waveguide during consecutive steps of fabrication process.
Figure 4B:
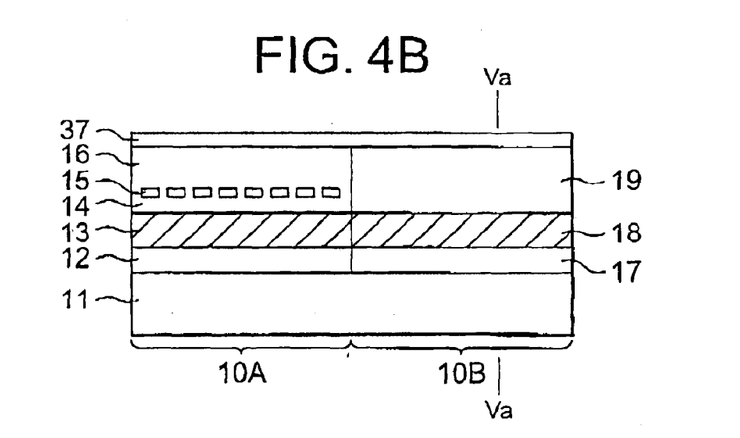
Figure 4C:
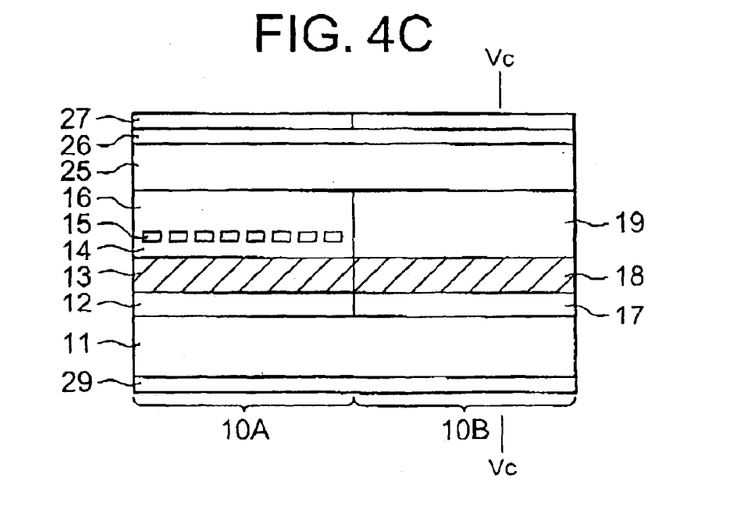
Figure 5A:
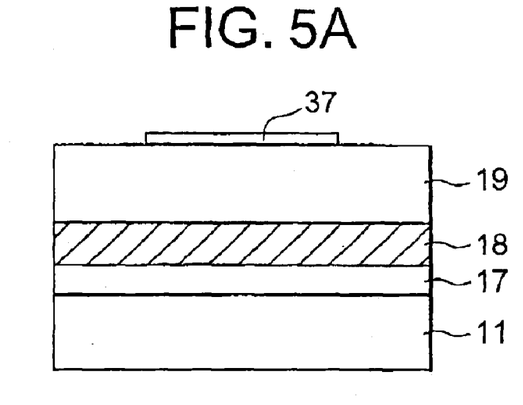
FIGS. 5A to 5C are sectional views of the EA-DFB module taken along lines Va—Va, Va—Va and Vc—Vc, respectively, in FIGS. 4B, 4B and 4C.
Figure 5B:
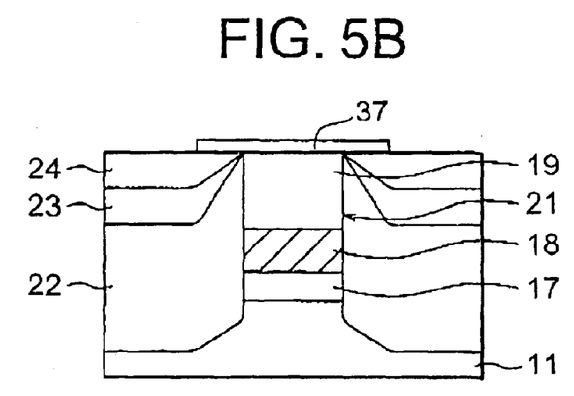
Figure 5C:
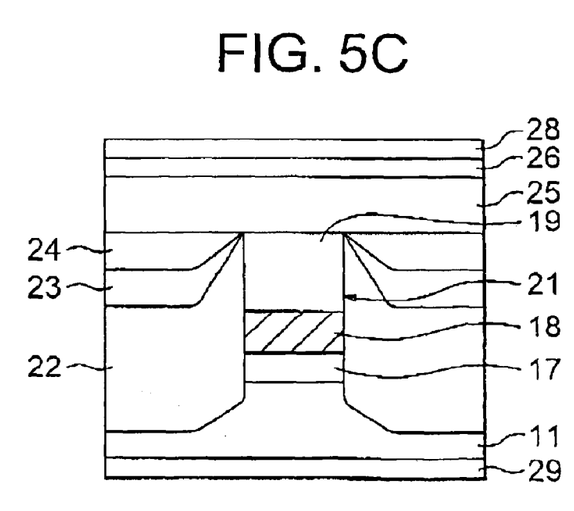

A fabrication process for the EA-DFB module 10 of the present embodiment will be described hereinafter. FIGS. 4A to 4C show the DFB laser area 10A in the consecutive steps of the fabrication process, whereas FIGS. 5A to 5C show the EA modulator area 10B in consecutively steps of the fabrication process.

First, the n-InP lower cladding layer 12, MQW-SCH active layer structure 13, p-InP spacer layer 14 and a diffraction grating layer are consecutively grown on the n-InP substrate 11 by using a metal-organic CVD (MOCVD) technique.

Subsequently, a photoresist mask having a diffraction grating pattern is formed on the diffraction grating layer, followed by dry etching the diffraction grating layer by using the photoresist mask as an etching mask to thereby form the diffraction grating 15. The diffraction grating 15 is formed only in the DFB laser area 10A. Thereafter, a buried p-InP layer is grown in the space of the diffraction grating and overlying the diffraction grating by using a MOCVD technique to form the p-InP upper cladding layer 16.

Subsequently, a butt joint mask 36 made of insulator such as SiN is formed on a portion of the p-InP upper cladding layer 16 to cover the DFB laser area 10A, as shown in FIG. 4A. The layers in the EA modulator area 10B exposed from the butt joint mask 36 are then etched to expose the surface of the n-InP substrate 11.

Thereafter, by using a MOCVD technique and the butt joint mask 36 as a selective growth mask, the n-InP lower cladding layer 17, MQW-SCH absorption layer structure 18 and p-InP upper cladding layer 19 are grown in the EA modulator area 10B on the exposed surface of the n-InP substrate 11. In this growth step, the thicknesses of the n-InP cladding layer 17 and MQW-SCH absorption layer structure 18 are matched with the thicknesses of the n-InP cladding layer 12 and MQW-SCH active layer structure 13. In addition, the top of the p-InP upper cladding layer 19 is aligned with the top of the p-InP upper cladding layer 16. The butt joint mask 36 is then removed.

Subsequently, a stripe mask 37 made of SiN, for example, having a width of about 4 μm is formed on the layer structure in both the DFB laser area 10A and EA modulator area 10B, as shown in FIGS. 4B and 5A. The stripe mask 37 is then used as an etching mask in a wet etching to form the mesa stripes 20 and 21.

The mesa stripe 20 thus formed in the DFB laser area 10A includes the p-InP upper cladding layer 16, diffraction grating 15, p-InP spacer layer 14, MQW-SCH active layer structure 13, n-InP lower cladding layer 12 and top portion of the n-InP substrate 11. The mesa stripe 21 formed in the EA modulator area 10B includes the p-InP upper cladding layer 19, MQW-SCH absorption layer structure 18, n-InP lower cladding layer 17 and top portion of the n-InP substrate 11. Each of the mesa stripes 20 and 21 has a width of around 2 μm.

Subsequently, the stripe mask 37 is used as a selective growth mask in both the DFB laser area 10A and EA modulator area 10B to consecutively grow the semi-insulating Fe-InP electron trapping layer 22, n-InP hole blocking layer 23 and i-InP layer 24 on both sides of respective mesa stripes 20 and 21 and the exposed n-InP substrate 11, as buried layers.

Although not illustrated in FIG. 5B, it is preferable to grow an n-InP diffusion blocking layer between the side surface of the mesa stripe and the n-InP hole blocking layer 23. The n-InP diffusion blocking layer may underlie or overlie the Fe-InP electron trapping layer 22. The diffusion blocking layer prevents the impurities in the n-InP layer 23 from diffusing into the mesa stripe. The preferable thickness of the diffusion blocking layer is 0.005 to 0.3 μm. It is also preferable that the n-InP diffusion blocking layer be not formed in the vicinity of the sides of the MQW active layer structure 18. The n-InP diffusion blocking layer has an impurity concentration of $1 \times 10^{16}$ cm$^{-3}$ to $5 \times 10^{18}$ cm$^{-3}$.

The n-InP hole blocking layer 23 may have a two-film structure including first and second n-InP films. The first n-InP film extends from the top of the side surface of the mesa stripe and resides between a (111) B-plane and a (11x) B-plane where x≧2. The second n-InP film overlies the first n-InP film and has an edge which is in contact with or 0.3 μm or less apart from the top of the side surface of the mesa stripe. For growing such a two-film n-InP hole blocking layer 23, it is preferable to use a two-step growth process. The two-step growth process is such that a lower growth rate is employed for growing the first n-InP film between the (111) B-plane and the (11x) B-plane, and a higher growth rate is employed for growing the second InP film after the growth plane of the n-InP layer reaches or exceeds the (11x) B-plane.

After removing the stripe mask 37, a MOCVD process is used to grow consecutively the p-InP upper cladding layer 25 and p-InGaAsP contact layer 26 on the mesa stripes 20 and 21 and the i-InP layer 24, as shown in FIGS. 4C and 5C. Thereafter, the p-side electrodes 27 and 28 are formed on the p-InP contact layer 26. The n-side electrode 29 is formed on the bottom surface of the n-InP substrate 11 after polishing the bottom surface.

The deep trench 30 is then formed outside the mesa stripes 20 and 21 in a spaced relationship therewith, followed by forming the isolation trench 31 at the boundary between the DFB laser area 10A and the EA modulator area 10B and some other steps to complete the EA-DFB module of FIG. 1.

Figure 6A:
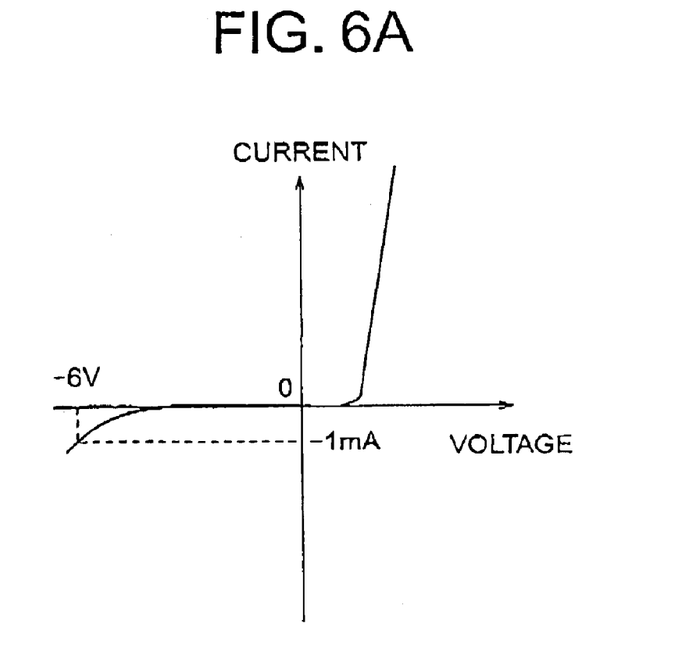
FIGS. 6A and 6B are graphs showing current-voltage characteristics of the EA-DFB module of the present embodiment and the conventional EA-DFB module, respectively.

For evaluating the performances of the EA modulator of the present embodiment, samples of the EA-DFB module were fabricated and subjected to the performance tests. The current-voltage characteristic of the EA modulator in the sample is shown in FIG. 6A, which exhibits an excellent reverse voltage tolerance characteristic of the EA modulator of the present embodiment. The extinction ratio of the EA modulator was 10 dB or higher at an applied voltage of −2 volts, which exhibits a considerably higher extinction ratio of the EA modulator at a relatively lower reverse voltage.

For comparison with the above embodiment, comparative examples were also manufactured, and subjected to similar performance tests. The comparative examples were similar to the samples of the present embodiment except that the current blocking structure formed outside the mesa stripes in contact therewith in the comparative example had a Fe-InP electron trapping layer and an n-InP hole blocking layer.

Figure 6B:
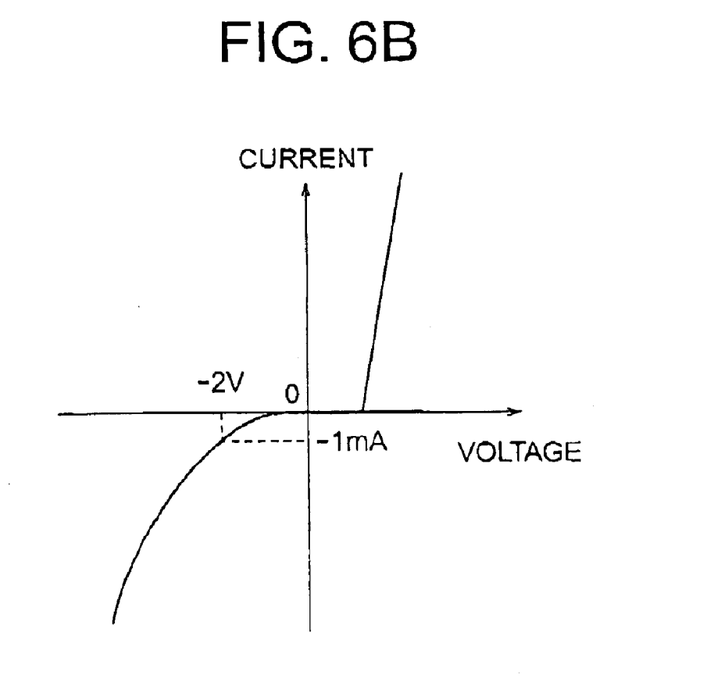

The EA modulators in the comparative examples had current-voltage characteristics such as shown in FIG. 6B, and an extinction ratio below 10 dB at an applied voltage of −2 volts.

From the above results, it was confirmed that the EA modulator of the present embodiment had a higher reverse voltage tolerance characteristic, and a higher extinction ratio at a bias voltage of −2 volts compared to the comparative examples and thus the conventional EA modulator.

The above samples and comparative examples were modified, wherein the process for configuring the mesa stripe was modified and the structure of the mesa was optimized. The overall characteristics of the modified samples and comparative examples could be significantly improved. However, the maximum reverse withstand voltage of the samples having the i-InP layers was −7 volts at an operating current of 0.1 mA, whereas the maximum reverse withstand voltage of the comparative examples having no i-InP layer was −2 volts at the operating current of 0.1 mA. Thus, it was confirmed that provision of the is InP layer improves the reverse voltage tolerance in the modifications.

In the above embodiment, since the buried layers are common in the DFB laser area and EA modulator area, the DFB laser diode in the EA-DFB module has a higher surge pulse tolerance characteristic although the DFB laser diode operates with a forward bias voltage at the p-n junction. In addition, the provision of the i-InP layer acting as a carrier-depleted layer in the current blocking structure scarcely affects the static characteristic of the laser diode. The i-InP layer must be provided at least in the EA modulator area in the present invention, and should be preferably provided in the DFB laser area as well.

Since the above embodiments are described only for examples, the present invention is not limited to the above embodiments and various modifications or alterations can be easily made therefrom by those skilled in the art without departing from the scope of the present invention.

For example, although the EA-DFB module described in the above embodiment uses an InGaAsP-based semiconductor material grown on an InP substrate, the present embodiment can be applied to an optical integrated device which uses an InGaAlAs-based material grown on an InP substrate, and InGaAsP- or InGaAlAs-based material in at least one of the active layer structure of the DFB laser and the absorption layer of the EA modulator. The thickness of the well layers, thickness of the barrier layers, number of well layers, dimensions of the mesa stripes, compositions of the layers, and the process conditions recited in the description are only examples, and may be modified as desired. Further, The present invention can be applied to an EA modulator having an absorption structure formed as a bulk, and the butt joint technique used in the above embodiment may be replaced by a selective growth technique. The present invention can be also applied to an EA-DBR module including an EA modulator and a DBR laser diode instead of the DFB laser diode.

What is claimed is:

1. An optical device comprising:
    a first-conductivity-type semiconductor substrate;
    a mesa stripe overlying said semiconductor substrate and including an active layer;
    a layer structure formed on both side surfaces of said mesa stripe in contact therewith, said layer structure including a semi-insulating layer, a first-conductivity-type buried layer and a carrier-depleted layer consecutively formed as viewed from said semiconductor substrate; and
    a second-conductivity-type cladding layer formed on said top of said mesa stripe and said carrier-depleted layer.

2. The optical device according to claim 1, wherein said optical device is an optical modulator.

3. The optical device according to claim 2, wherein said active layer absorbs laser.

4. The optical device according to claim 3, wherein said active layer comprises InGaAsP- or InGaAlAs-based semiconductor material.

5. The optical device according to claim 3, wherein said active layer has a multiple quantum well structure including Tl.

6. The optical device according to claim 3, wherein said semi-insulating film is either a Fe-doped or a Ru-doped InP layer, said first-conductivity-type buried layer is an impurity-doped InP layer, and said carrier-depleted layer is an undoped InP layer.

7. The optical device according to claim 6, wherein said impurity-doped InP layer has a carrier density between $1 \times 10^{18}$ cm$^{-3}$ and $1 \times 10^{19}$ cm$^{-3}$.

8. The optical device according to claim 4, wherein said semi-insulating layer is a Fe-doped or Ru-doped InP layer, said first-conductivity-type buried layer is an impurity-doped InP layer, and said carrier-depleted layer is a Fe-doped or Ru-doped InP layer.

9. The optical device according to claim 8, wherein said impurity-doped InP layer has a carrier density between $1 \times 10^{18}$ cm$^{-3}$ and $1 \times 10^{19}$ cm$^{-3}$.

10. The optical device according to claim 1, wherein said carrier-depleted layer has a thickness of 0.1 to 0.5 µm.

11. The optical device according to claim 1, wherein said first-conductivity-type buried layer includes a first buried film and a second buried film overlying said first buried film, said first buried film has a top semiconductor surface extending from a top of each side surface of said mesa stripe between a (111) B-plane or (11x) B-plane where x≧2, and at least an edge portion of said second buried film resides within 0.3 µm from said top of said each side surface of said mesa stripe.

12. The optical device according to claim 11, wherein said semiconductor substrate comprises III–V group compound semiconductor material and has a (100) plane, said mesa stripe extending on said (100) plane in a [011] orientation.

13. The optical device according to claim 1, further comprising a diffusion suppression layer between said mesa stripe and said first-conductivity-type buried layer.

14. The optical device according to claim 13, wherein said diffusion suppression layer has a thickness of 0.005 to 0.3 µm.

15. The optical device according to claim 13, wherein each of said layers comprises an InP-based semiconductor material, said first conductivity type is an n-type, said second conductivity type is a p-type, and said diffusion suppression layer includes at least one of a Fe-doped InP layer, a Ru-doped InP layer, an n-type InP layer and an undoped InP layer.

16. The optical device according to claim 15, wherein said diffusion suppression layer includes an n-type InP layer, and said n-type InP layer is in a spaced relationship with said side surface of said mesa stripe.

17. The optical device according to claim 16, wherein said diffusion suppression layer includes an n-type InP layer, said n-type InP layer having an impurity concentration between $1 \times 10^{16}$ cm$^{-3}$ and $5 \times 10^{18}$ cm$^{-3}$.

18. The optical device according to claim 16, wherein said diffusion suppression layer includes a Fe-doped or Ru-doped InP layer, said Fe-doped or Ru-doped InP layer has an impurity concentration between $1 \times 10^{16}$ cm$^{-3}$ and $1 \times 10^{17}$ cm$^{-3}$.

19. An optical integrated device comprising the optical device according to any one of claims 1 to 18, and a distributed feedback (DFB) laser diode, which are integrated on said first-conductivity-type semiconductor substrate in a monolithic structure.

20. A method for manufacturing an optical modulator, comprising the steps of:
    forming a mesa stripe overlying a first-conductivity-type semiconductor substrate and including an active layer;
    forming consecutively a semi-insulating film, a first-conductivity-type buried layer, and a carrier-depleted layer, which are buried on both side surfaces of said mesa stripe; and
    forming a second-conductivity-type cladding layer on top of said mesa stripe and said carrier-depleted layer, wherein:
    said first-conductivity-type buried layer is grown on a first growth rate when a plane orientation of said first first-conductivity-type buried layer extending from a top of said side surface of said mesa stripe resides between a (111) B-plane and a (11x) B-plane, and grown on a second growth rate larger than said first growth rate after said plane orientation reaches a (11x) plane where x≧2.

* * * * *